United States Patent
Yu et al.

(10) Patent No.: US 11,757,018 B2
(45) Date of Patent: Sep. 12, 2023

(54) FORMATION METHOD OF SEMICONDUCTOR DEVICE WITH GATE ALL AROUND STRUCTURE

(71) Applicant: Taiwan Semiconductor Manufacturing Company, Ltd., Hsinchu (TW)

(72) Inventors: Te-An Yu, Taipei (TW); Hung-Ju Chou, Taipei (TW); Jet-Rung Chang, Hsinchu County (TW); Yen-Po Lin, Taipei (TW); Jiun-Ming Kuo, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 281 days.

(21) Appl. No.: 17/332,730

(22) Filed: May 27, 2021

(65) Prior Publication Data
US 2022/0384605 A1  Dec. 1, 2022

(51) Int. Cl.
*H01L 21/22* (2006.01)
*H01L 29/66* (2006.01)
(Continued)

(52) U.S. Cl.
CPC ........ *H01L 29/6653* (2013.01); *H01L 21/223* (2013.01); *H01L 29/66545* (2013.01);
(Continued)

(58) Field of Classification Search
CPC ........... H01L 29/0673; H01L 29/42392; H01L 29/66787; H01L 29/78696;
(Continued)

(56) References Cited

U.S. PATENT DOCUMENTS 6,498,079 B1 * 12/2002 Bryant ............... H01L 21/2256
216/99
9,209,247 B2    12/2015 Colinge et al.
(Continued)

OTHER PUBLICATIONS

Pelosi, Matteo, "From FinFET to Nanosheet Si-SiGe GAAFET: fabrication process simulation and analysis", Politecnico Di Torino p. 40-57, Jul. 2021. (Year: 2021).*

*Primary Examiner* — Eric A. Ward
*Assistant Examiner* — Zachary Taylor Nix
(74) *Attorney, Agent, or Firm* — Birch, Stewart, Kolasch & Birch, LLP

(57) ABSTRACT

A method for forming a semiconductor device structure is provided. The method includes forming an n-type doped region in a semiconductor substrate and forming a semiconductor stack over the semiconductor substrate. The semiconductor stack has multiple sacrificial layers and multiple semiconductor layers laid out alternately. The method also includes introducing n-type dopants from the n-type doped region into the semiconductor stack during the forming of the semiconductor stack. The method further includes patterning the semiconductor stack to form a fin structure and forming a dummy gate stack to wrap around a portion of the fin structure. In addition, the method includes removing the dummy gate stack and the sacrificial layers to release multiple semiconductor nanostructures made up of remaining portions of the semiconductor layers. The method includes forming a metal gate stack to wrap around the semiconductor nanostructures.

20 Claims, 13 Drawing Sheets

(51) Int. Cl.
*H01L 21/223* (2006.01)
*H01L 21/02* (2006.01)
*H01L 29/06* (2006.01)
*H01L 29/423* (2006.01)
*H01L 29/786* (2006.01)

(52) U.S. Cl.
CPC .. *H01L 29/66553* (2013.01); *H01L 29/66742* (2013.01); *H01L 21/0245* (2013.01); *H01L 21/02507* (2013.01); *H01L 21/02513* (2013.01); *H01L 21/02532* (2013.01); *H01L 21/02576* (2013.01); *H01L 29/0665* (2013.01); *H01L 29/42392* (2013.01); *H01L 29/6656* (2013.01); *H01L 29/78696* (2013.01)

(58) Field of Classification Search
CPC ............. H01L 21/02694; H01L 21/041; H01L 21/38–388; H01L 21/76858; H01L 21/22–2258; H01L 21/223–2236
See application file for complete search history.

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2003/0003646 | A1* | 1/2003 | De Boer ........... H01L 21/02532 438/222 |
| 2016/0254186 | A1* | 9/2016 | Leib .................. H01L 21/76883 257/383 |
| 2019/0355723 | A1* | 11/2019 | Miao ................. H01L 29/78684 |
| 2022/0181499 | A1* | 6/2022 | Jung ..................... H01L 29/775 |

* cited by examiner

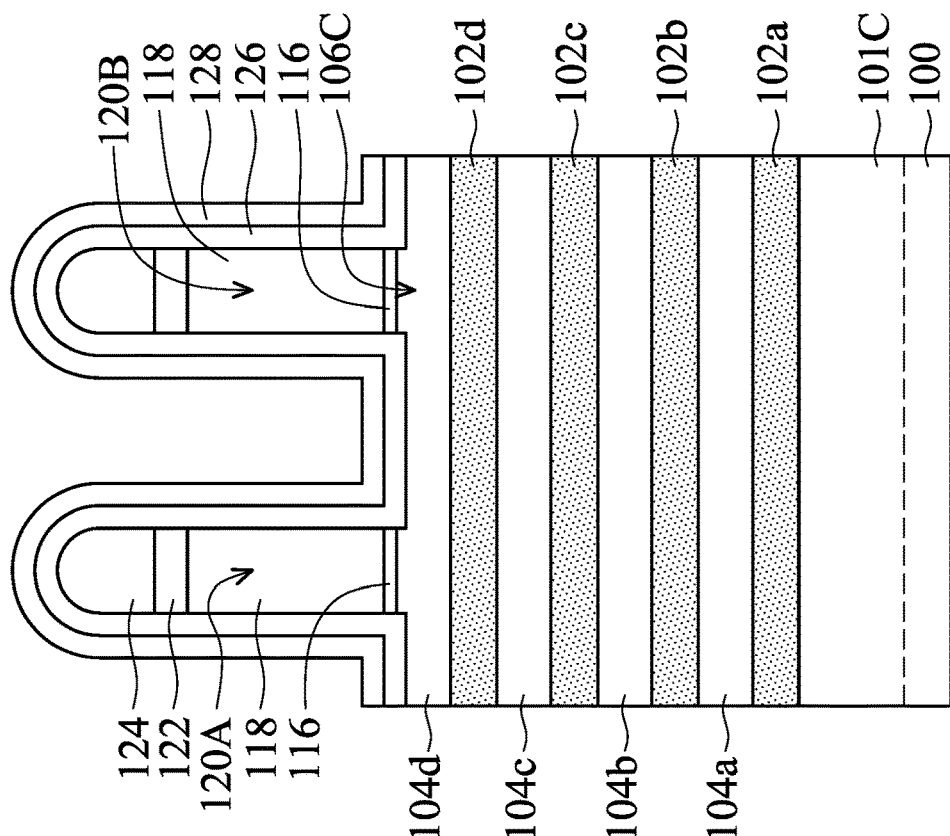
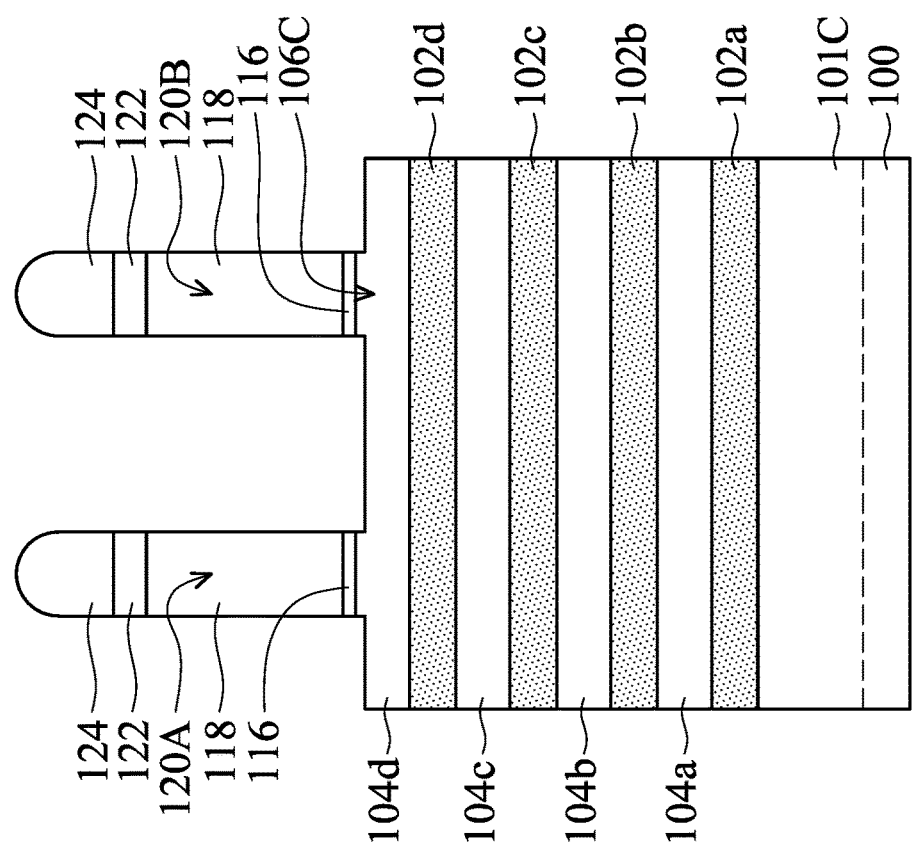

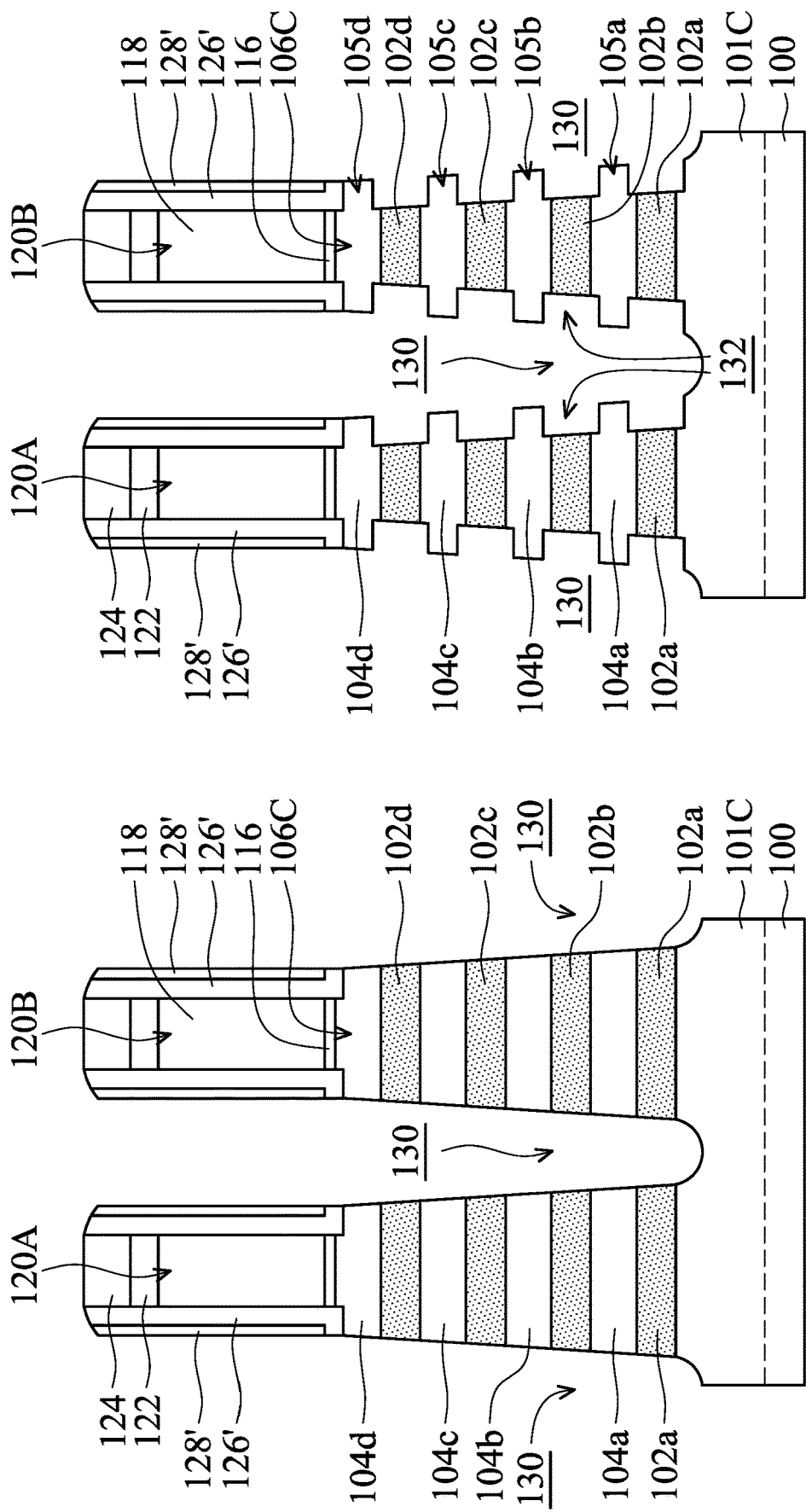

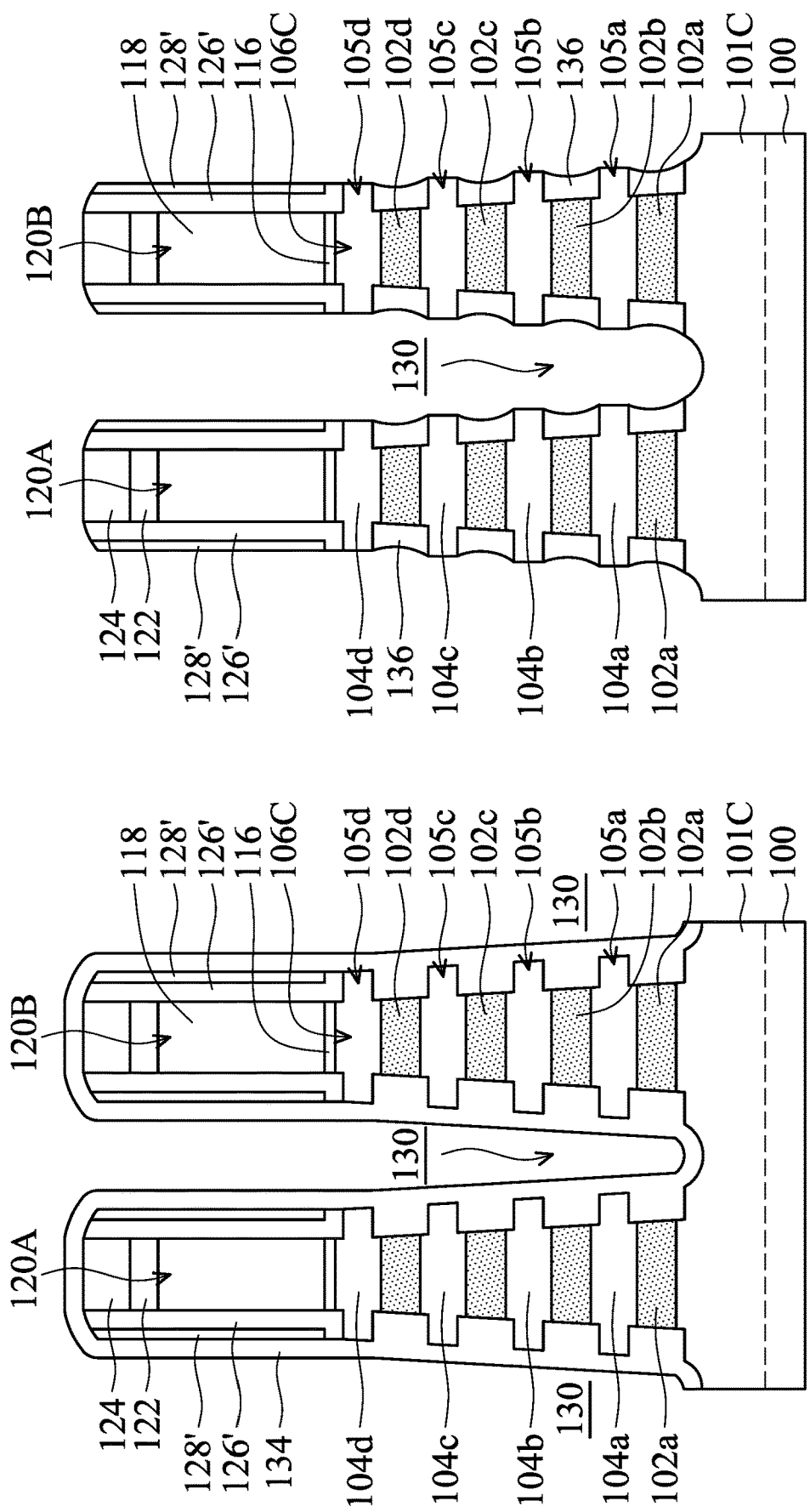

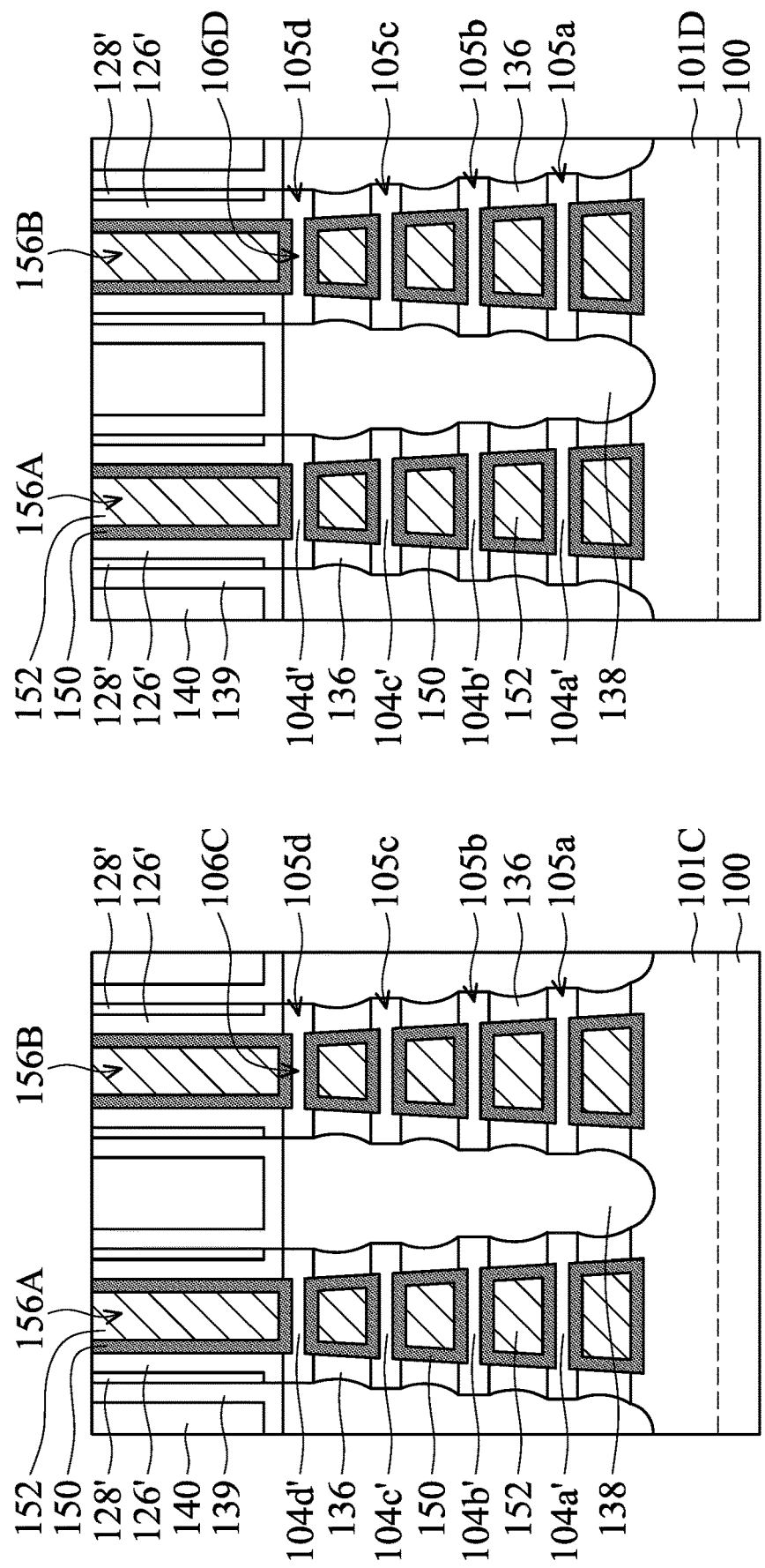

FORMATION METHOD OF SEMICONDUCTOR DEVICE WITH GATE ALL AROUND STRUCTURE

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3K are cross-sectional views of various stages of a process for forming a portion of a semiconductor device structure, in accordance with some embodiments.

FIG. 4 is a cross-sectional view of a portion of a semiconductor device structure, in accordance with some embodiments.

DETAILED DESCRIPTION

Figure 1A:
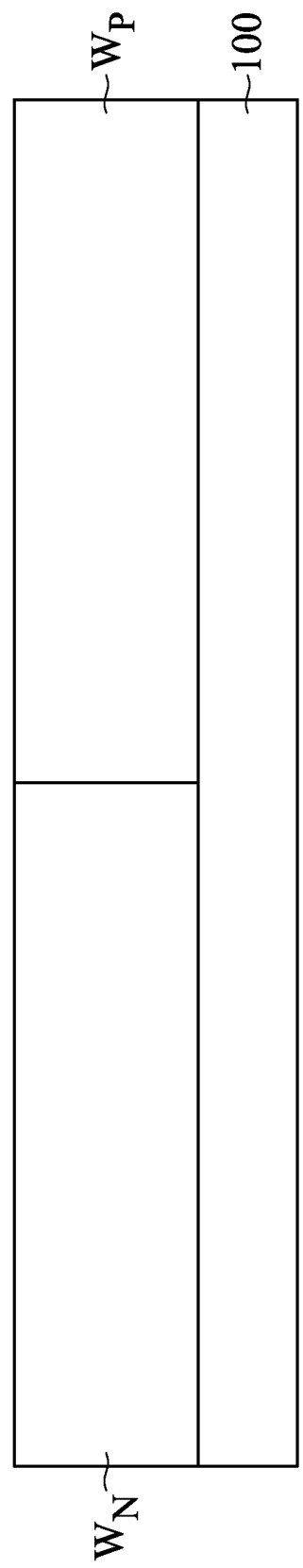
FIGS. 1A-1F are cross-sectional views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may also relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1F are cross-sectional views of various stages of a process for forming a portion of a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, a first doped region $W_N$ and a second doped region $W_P$ are formed in the semiconductor substrate 100, in accordance with some embodiments. In some embodiments, the first doped region $W_N$ and the second doped region $W_P$ function as well regions. In some embodiments, the first doped region $W_N$ functions as a n-well region where PMOS devices will be formed, and the second doped region $W_P$ functions as a p-well region where NMOS devices will be formed. In some embodiments, the first doped region $W_N$ is doped with n-type dopants such as phosphor, and the second doped region $W_P$ is doped with p-type dopants such as boron. In some embodiments, the first doped region $W_N$ and a second doped region $W_P$ are sequentially formed using an ion implantation process, a plasma immersion ion implantation process, a gas and/or solid source diffusion process, one or more other applicable processes, or a combination thereof.

Figure 1B:
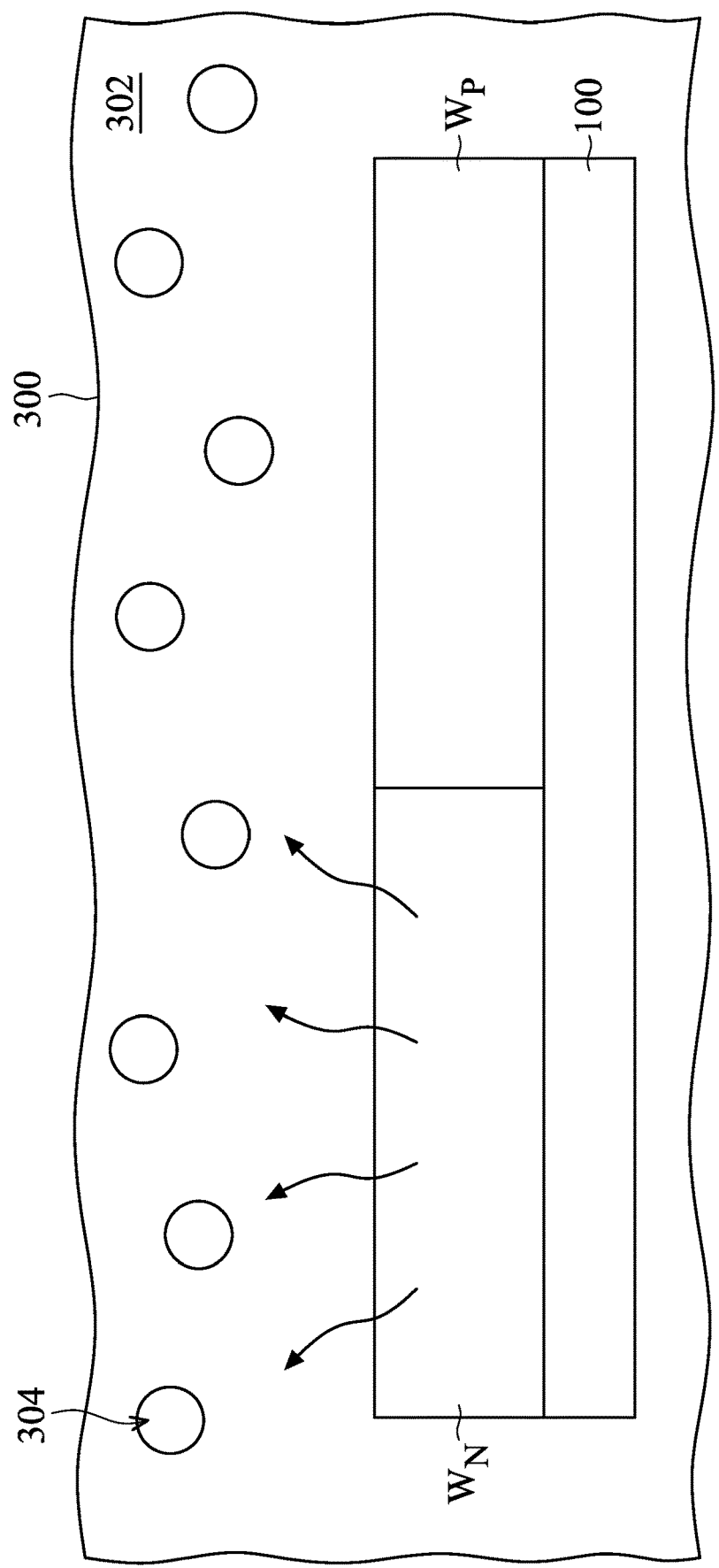

As shown in FIG. 1B, the structure shown in FIG. 1A is transferred into a reaction chamber 300 for subsequent processes, in accordance with some embodiments. In some embodiments, the reaction chamber 300 is a closed reaction chamber that forms a closed space 302 that contains the semiconductor substrate 100, as shown in FIG. 1B.

In some embodiments, a thermal operation is conducted to the semiconductor substrate 100 in the reaction chamber 300. As a result, some dopants 304 that are originally in the first doped region $W_N$ diffuse out of the first doped region $W_N$. The dopants 304 such as phosphor ions and/or phosphor-containing ions are thus spread in the closed space 302.

In some embodiments, the thermal operation is performed at an operation temperature that is in a range from about 900 degrees C. to about 1100 degrees C. The thermal operation may be performed for about 10 seconds to about 60 seconds. In some embodiments, the thermal operation is performed at about 930 degrees C. for about 20 seconds. In some embodiments, the thermal operation may help to reduce the surface roughness of the semiconductor substrate 100, which may facilitate a subsequent formation of a semiconductor stack on the semiconductor substrate 100.

In some cases where the operation temperature is lower than about 900 degrees C., there might not be sufficient amount of dopants diffuse into the closed space 302. As a result, a subsequent process might be negatively affected. In some other cases where the operation temperature is higher than about 1100 degrees C., some defects might be formed in the semiconductor substrate 100, which is also not desired either.

In some embodiments, hydrogen gas is introduced into the reaction chamber 300 during the thermal operation mentioned above. The hydrogen gas may help to reduce or remove the native oxide layer grown on the surface of the semiconductor substrate 100, which may further facilitate the subsequent formation of the semiconductor stack on the semiconductor substrate 100.

Figure 1C:
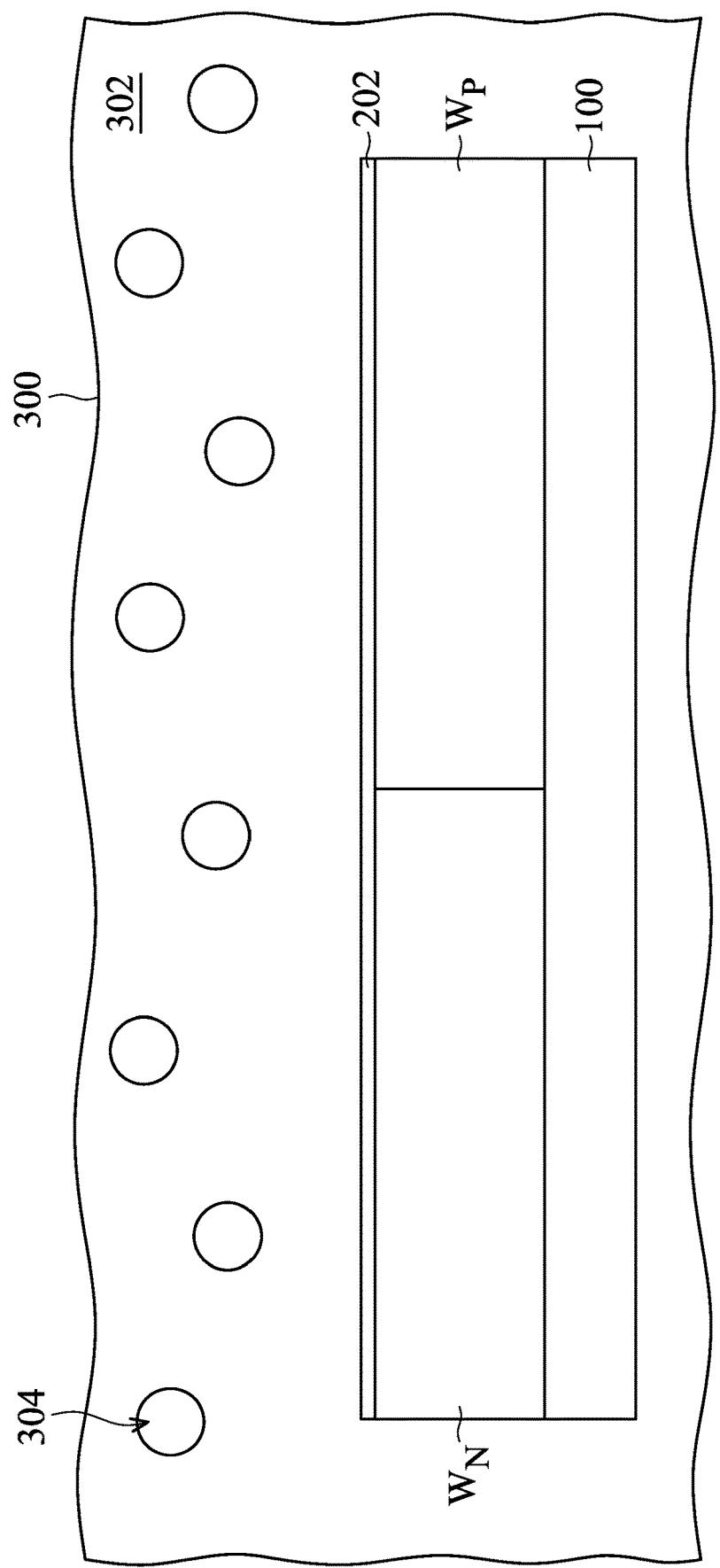

As shown in FIG. 1C, a semiconductor seed layer 202 is formed over the semiconductor substrate 100, in accordance with some embodiments. The semiconductor seed layer 202 may facilitate a subsequent epitaxial growth process of the semiconductor stack. The semiconductor seed layer 202 may be made of or include silicon, germanium, one or more other suitable materials, or a combination thereof. In some embodiments, the semiconductor seed layer 202 is a single crystalline silicon layer.

In some embodiments, the semiconductor seed layer 202 is formed in-situ in the reaction chamber 300. The semiconductor seed layer 202 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an atomic layer deposition (ALD) process, one or more other applicable processes, or a combination thereof. In some embodiments, the semiconductor seed layer 202 is formed at a temperature that is lower than the thermal operation illustrated in FIG. 1B. The semiconductor seed layer 202 may be formed at a temperature that is in a range from about 850 degrees C. to about 950 degrees C.

In some embodiments, the vacuum of the reaction chamber 300 is not broken during the thermal process of the semiconductor substrate 100 and the formation of the semiconductor seed layer 202. The semiconductor substrate 100 is not taken out of the reaction chamber 300 after the semiconductor substrate 100 is heated and before the semiconductor seed layer 202 is formed.

Embodiments of the disclosure are not limited thereto. Many variations and/or modifications can be made to embodiments of the disclosure. In some other embodiments, the semiconductor seed layer 202 is not formed.

Figure 1D:
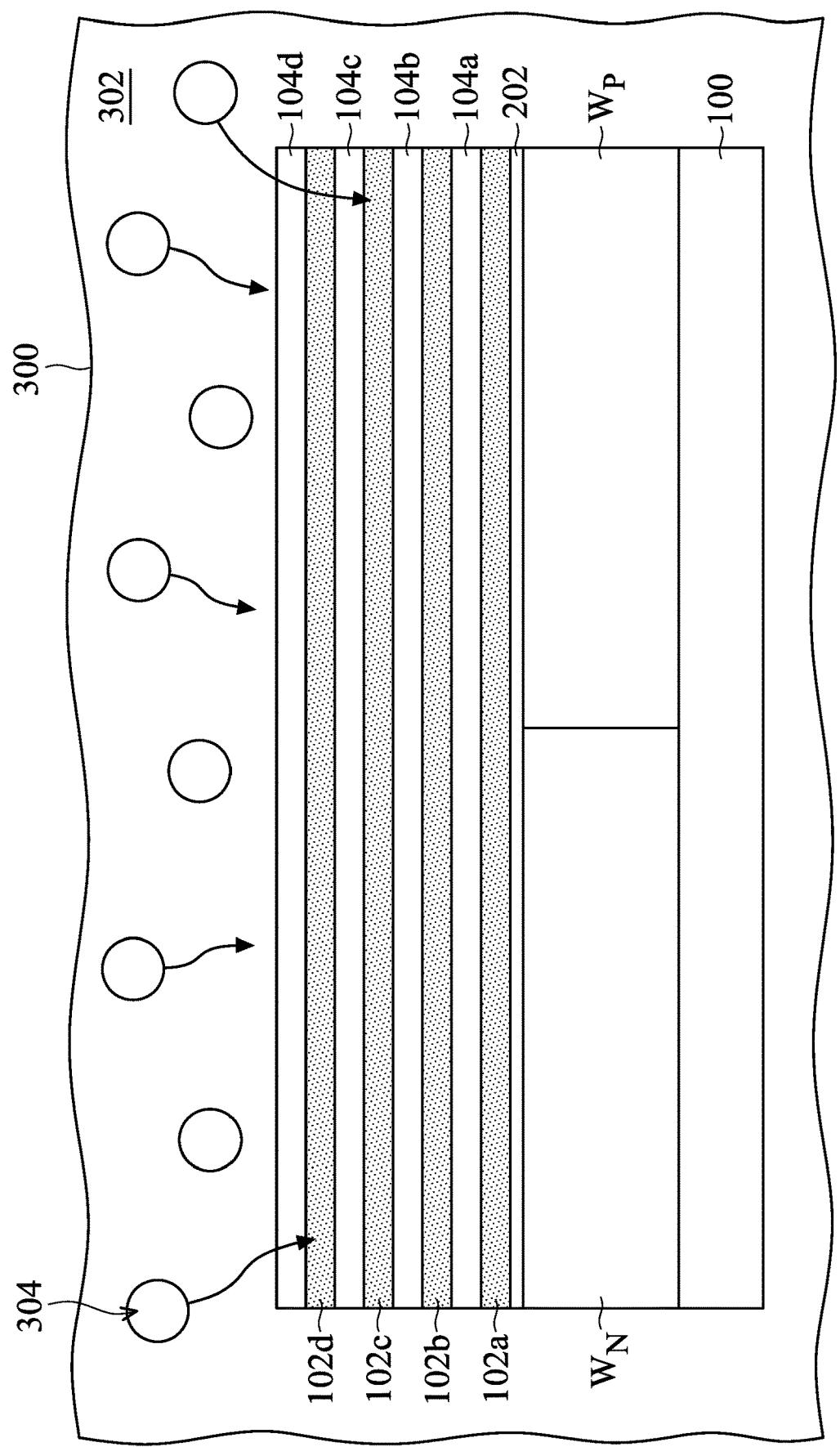

As shown in FIG. 1D, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 1D. In some embodiments, the semiconductor stack is formed directly on the semiconductor seed layer 202.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104s. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an atomic layer deposition (ALD) process, one or more other applicable processes, or a combination thereof.

In some embodiments, the semiconductor layers 102a-102d and 104a-104d are formed at a temperature that is lower than the thermal operation illustrated in FIG. 1B. The semiconductor layers 102a-102d and 104a-104d may be formed at a temperature that is in a range from about 600 degrees C. to about 700 degrees C.

In some embodiments, the semiconductor layers 102a-102d and 104a-104d are grown in-situ in the process chamber 300. In some embodiments, the growth of the semiconductor layers 102a-102d and 104a-104d are alternately and sequentially performed in the process chamber 300 to complete the formation of the semiconductor stack. In some embodiments, the vacuum of the process chamber 300 is not broken before the epitaxial growth of the semiconductor stack is accomplished. In some embodiments, the semiconductor substrate 100 is not taken out of the reaction chamber 300 after the semiconductor substrate is heated (as illustrated in FIG. 1B) and before the semiconductor stack is formed (as illustrated in FIG. 1D).

As shown in FIG. 1D, the dopants 304 that diffuse into the closed space 302 is introduced into the semiconductor stack during the formation of the semiconductor stack, in accordance with some embodiments. As a result, the semiconductor layers 102a-102d and the semiconductor layers 104a-104d are doped with some of the dopants 304 that come from the first doped region $W_N$.

In some embodiments, the vacuum of the process chamber 300 is not broken while the semiconductor stack is epitaxially grown. In some embodiments, the semiconductor substrate 100 is not taken out of the reaction chamber 300 after the semiconductor substrate is heated (as illustrated in FIG. 1B) and before the introduction of dopants 304 into the semiconductor stack (as illustrated in FIG. 1D).

In some embodiments, due to the introduction of the dopants 304 into the semiconductor stack, the etching selectivity between the semiconductor layers 102a-102d and the semiconductor layers 104a-104d is improved. For example, the etching rate of the semiconductor layers 102a-102d may have a 10% to 15% increase when the dopant concentration of phosphor in the semiconductor layers 102a-102d is increased. For example, the atomic concentration of phosphor in the semiconductor layers 102a-102d may be in a range from about $10^{17}$ atoms/cm$^3$ to about $10^{20}$ atoms/cm$^3$. Since the semiconductor layers 102a-102d that function as sacrificial layers could be etched at a greater rate, the process window is greatly enlarged. The performance and reliability of the semiconductor device structure are improved.

Figure 1E:
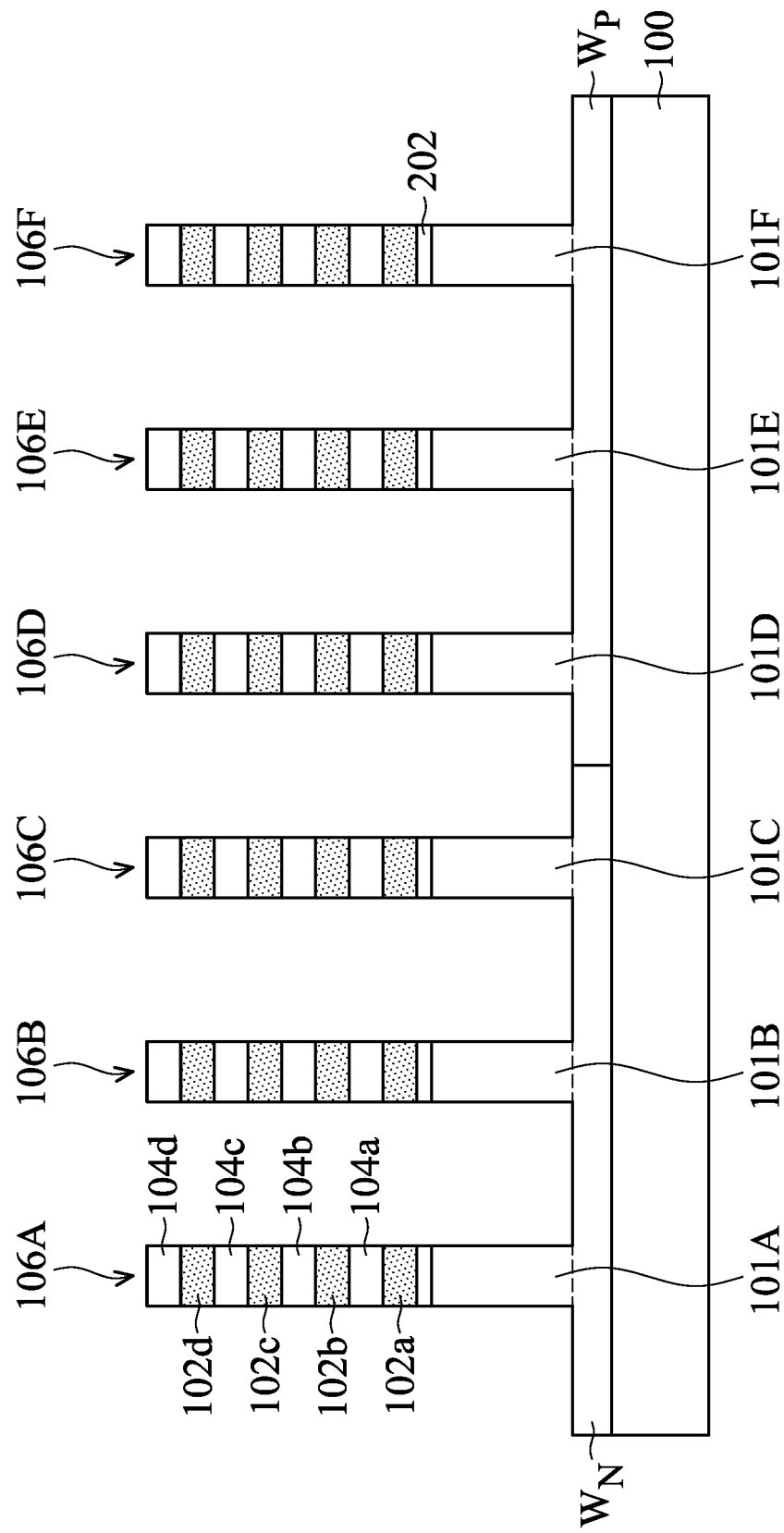

As shown in FIG. 1E, the semiconductor stack is patterned to form multiple fin structures 106A to 106F, in accordance with some embodiments. In some embodiments, hard mask elements (not shown) are formed over the semiconductor stack to assist in the patterning of the semiconductor stack. One or more photolithography processes and one or more etching processes are used to pattern the semiconductor stack into the fin structures 106A-106E, as shown in FIG. 1E in accordance with some embodiments.

The fin structures 106A-106E may be patterned by any suitable method. For example, the fin structures 106A-106E may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches, as shown in FIG. 1E. Each of the fin structures 106A-106E may include portions of the semiconductor layers 102a-102d and 104a-104d and semiconductor fins 101A, 101B, 101C, 101D, and 101E. The semiconductor substrate 100 may also be partially removed during the etching process that forms the fin structures 106A-106E. Protruding portions of the semiconductor substrate 100 that remain form the semiconductor fins 101A-101E.

Each of the hard mask elements may include a first mask layer and a second mask layer. The first mask layer and the second mask layer may be made of different materials. In some embodiments, the first mask layer is made of a material that has good adhesion to the semiconductor layer 104d. The first mask layer may be made of silicon oxide, germanium oxide, silicon germanium oxide, one or more other suitable materials, or a combination thereof. The second layer may be made of silicon nitride, silicon oxynitride, silicon carbide, one or more other suitable materials, or a combination thereof.

Figure 2:
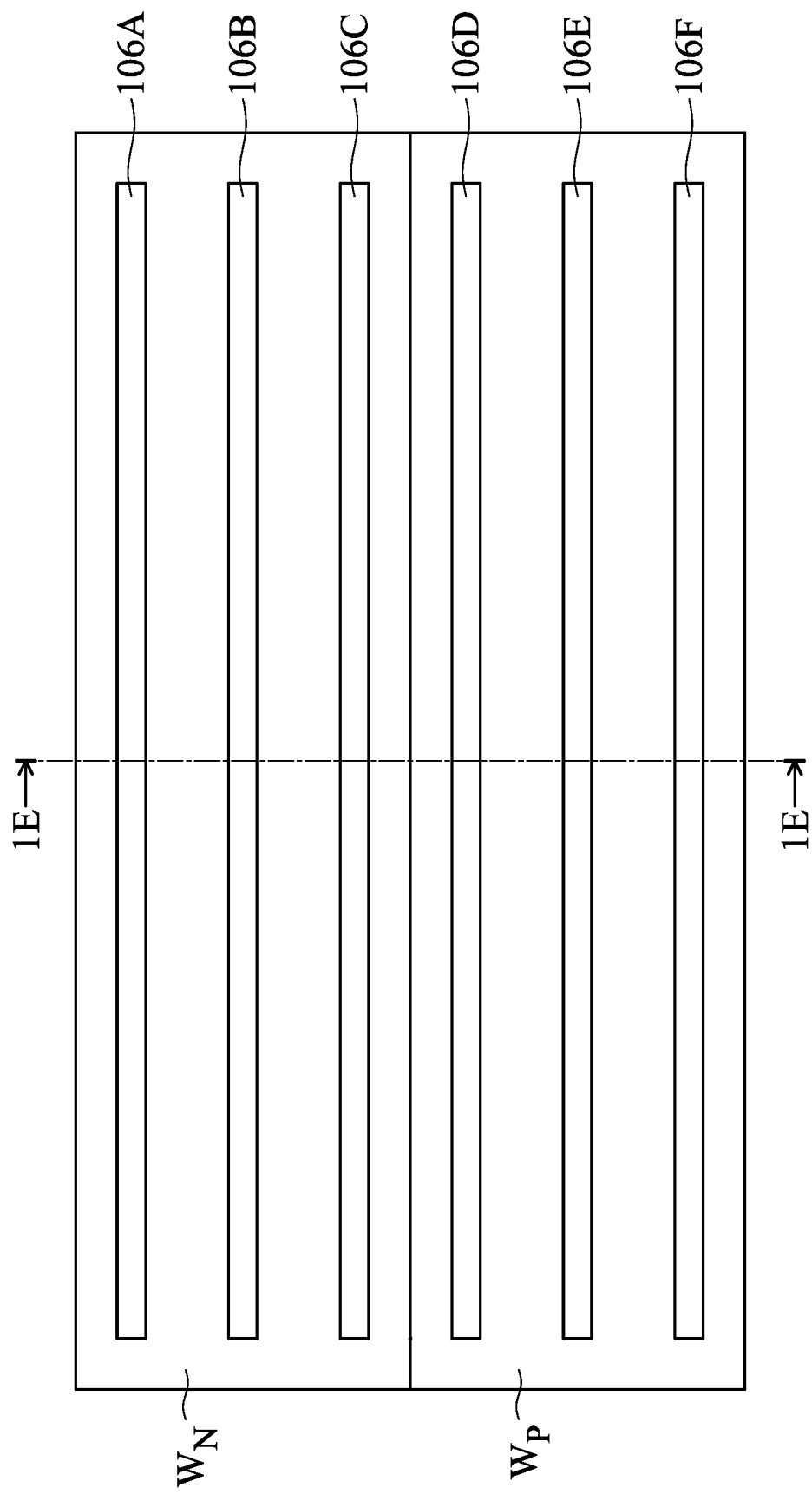
FIG. 2 is a top view of an intermediate stage of a process for forming a portion of a semiconductor device structure, in accordance with some embodiments.

FIG. 2 is a top view of an intermediate stage of a process for forming a portion of a semiconductor device structure, in accordance with some embodiments. In some embodiments, FIG. 2 shows the top view of the structure shown in FIG. 1E. In some embodiments, the fin structures 106A-106E are oriented lengthwise. In some embodiments, the lengthwise extending directions of the fin structures 106A-106E are substantially parallel to each other, as shown in FIG. 2. In some embodiments, FIG. 1E is a cross-sectional view of the structure taken along the line 1E-1E in FIG. 2.

Figure 1F:
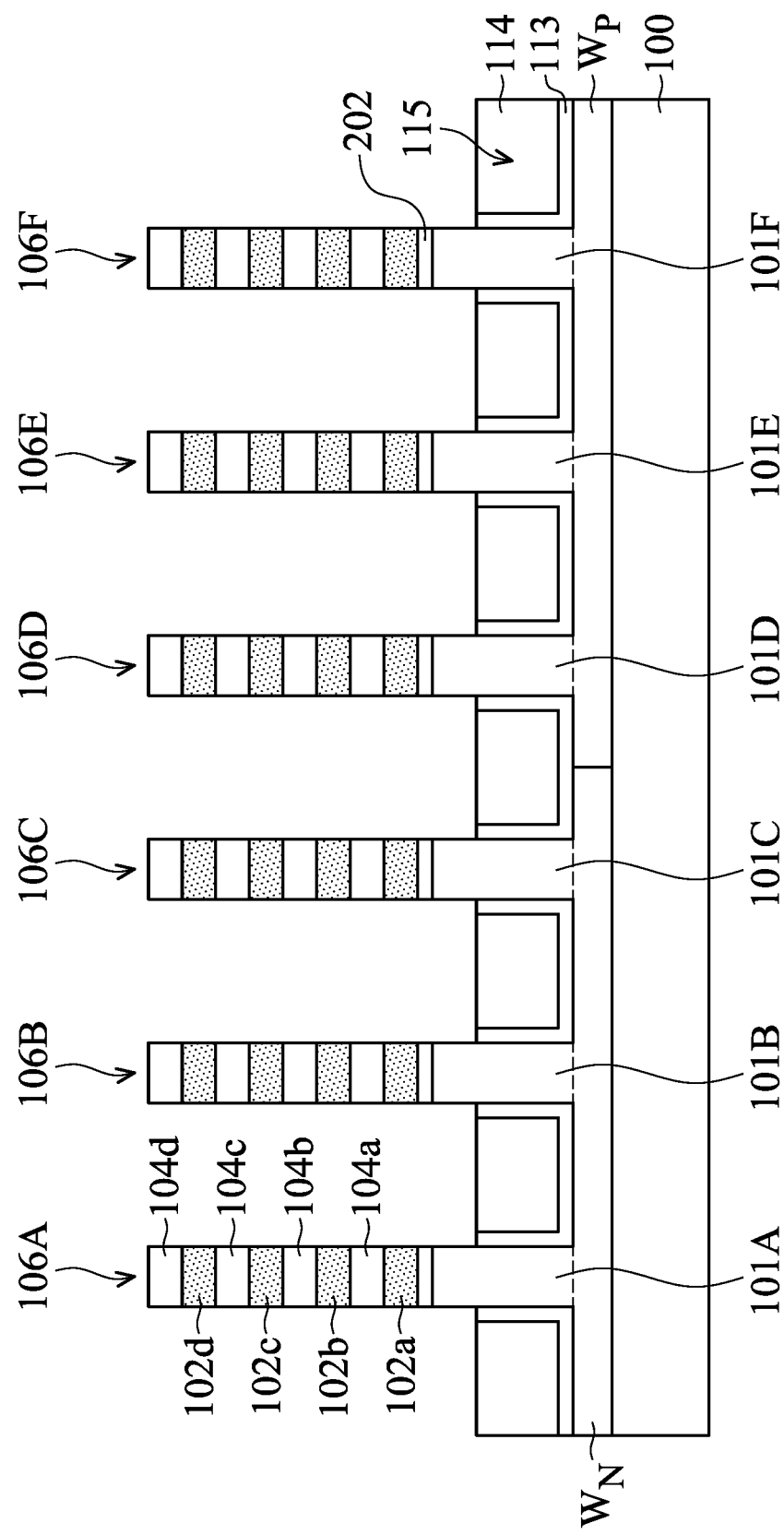

As shown in FIG. 1F, an isolation structure 115 is formed to surround lower portions of the fin structures 106A-106E, in accordance with some embodiments. In some embodiments, the isolation structure 115 includes dielectric fillings 114 a liner layer 113 that is adjacent to the semiconductor fins 101A-101E. In some embodiments, one or more dielectric layers are deposited over the fin structures 106A-106E and the semiconductor substrate 100 to overfill the trenches formed in the semiconductor stack.

The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106A-106E protrude from the top surface of the isolation structure 115, as shown in FIG. 1F.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 3H:
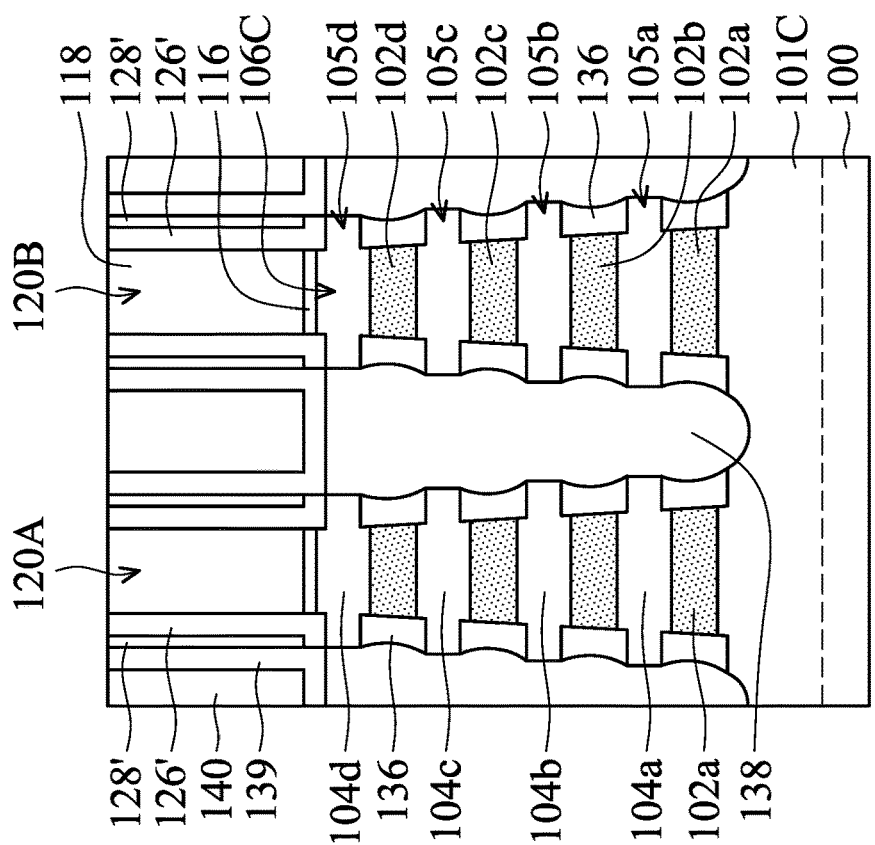

Afterwards, dummy gate stacks are formed to extend across the fin structures 106A-106E, in accordance with some embodiments. FIGS. 3A-3K are cross-sectional views of various stages of a process for forming a portion of a semiconductor device structure, in accordance with some embodiments In some embodiments, FIG. 3A is a cross-sectional view of the structure taken along the lengthwise extending direction of the fin structure 106C after dummy gate stacks 120A and 120B are formed.

In some embodiments, the dummy gate stacks 120A and 120B are formed to partially cover and to extend across the fin structure 106C. In some embodiments, the dummy gate stacks 120A and 120B wraps around the fin structure 106C. In some embodiments, each of the dummy gate stacks 120A and 120B includes a dummy gate dielectric layer 116 and a dummy gate electrode 118, as shown in FIG. 3A. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A-106E. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

As shown in FIG. 3B, spacer layers 126 and 128 are afterwards deposited over the dummy gate stacks 120A and 120B and the fin structure 106C, in accordance with some embodiments. The spacer layers 126 and 128 extend along the tops and sidewalls of the dummy gate stacks 120A and 120B, as shown in FIG. 3B. The spacer layers 126 and 128 extend along the top of the fin structure 106C, as shown in FIG. 3B.

The spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

As shown in FIG. 3C, the fin structure 106C is partially removed to form recesses 130, in accordance with some embodiments. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106C. In some embodiments, the recesses 130 further extend into the semiconductor fin 101C, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched. In some embodiments, due to the introduction of the dopants 304 into the semiconductor layers 102a-102d (as illustrated in FIG. 1D), the process window for forming the recesses 132 are enlarged.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (that function as, for example, source/drain structures) from being damaged during a subsequent process for removing the sacrificial layers 102b-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101C originally covered by the insulating layer 134 are exposed by the recesses 130, as shown in FIG. 3F. The edges of the semiconductor layers 104a-104d are exposed by the recesses 130, as shown in FIG. 3F.

Figure 3G:
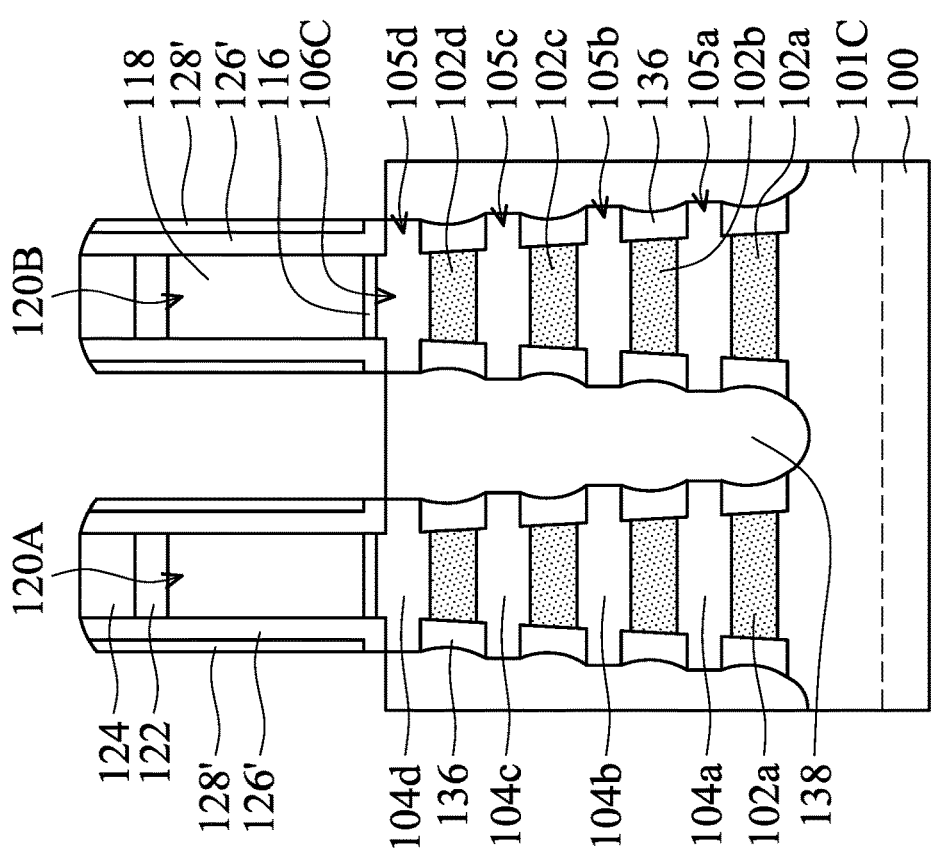

As shown in FIG. 3G, epitaxial structures 138 are formed, in accordance with some embodiments. In some embodiments, the epitaxial structures 138 fill the recesses 130, as shown in FIG. 3G. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Each of the semiconductor layers 104a-104d is sandwiched between two of the epitaxial structures 138. In some embodiments, the epitaxial structures 138 are p-type doped regions. The epitaxial structures 138 may include epitaxially grown silicon germanium (SiGe), epitaxially grown silicon, or another suitable epitaxially grown semiconductor material.

However, embodiments of the disclosure are not limited thereto. In some other embodiments, the epitaxial structures 138 are n-type doped regions. For example, the epitaxial structures 138 formed on the second doped region $W_P$ may be n-type doped regions. The epitaxial structures 138 may include epitaxially grown silicon, epitaxially grown silicon carbide (SiC), epitaxially grown germanium, or another suitable epitaxially grown semiconductor material.

In some embodiments, the epitaxial structures 138 are doped in-situ during their epitaxial growth. The initial reaction gas mixture for forming the epitaxial structures 138 contains dopants. In some other embodiments, the epitaxial structures 138 are not doped during the growth of the epitaxial structures 138. Instead, after the formation of the epitaxial structures 138, the epitaxial structures 138 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 are further exposed to one or more annealing processes to activate the dopants. For example, a rapid thermal annealing process is used.

As shown in FIG. 3H, a contact etch stop layer 139 and a dielectric layer 140 are formed to cover the epitaxial structures 138, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level with each other.

Figures 3I, 3J:
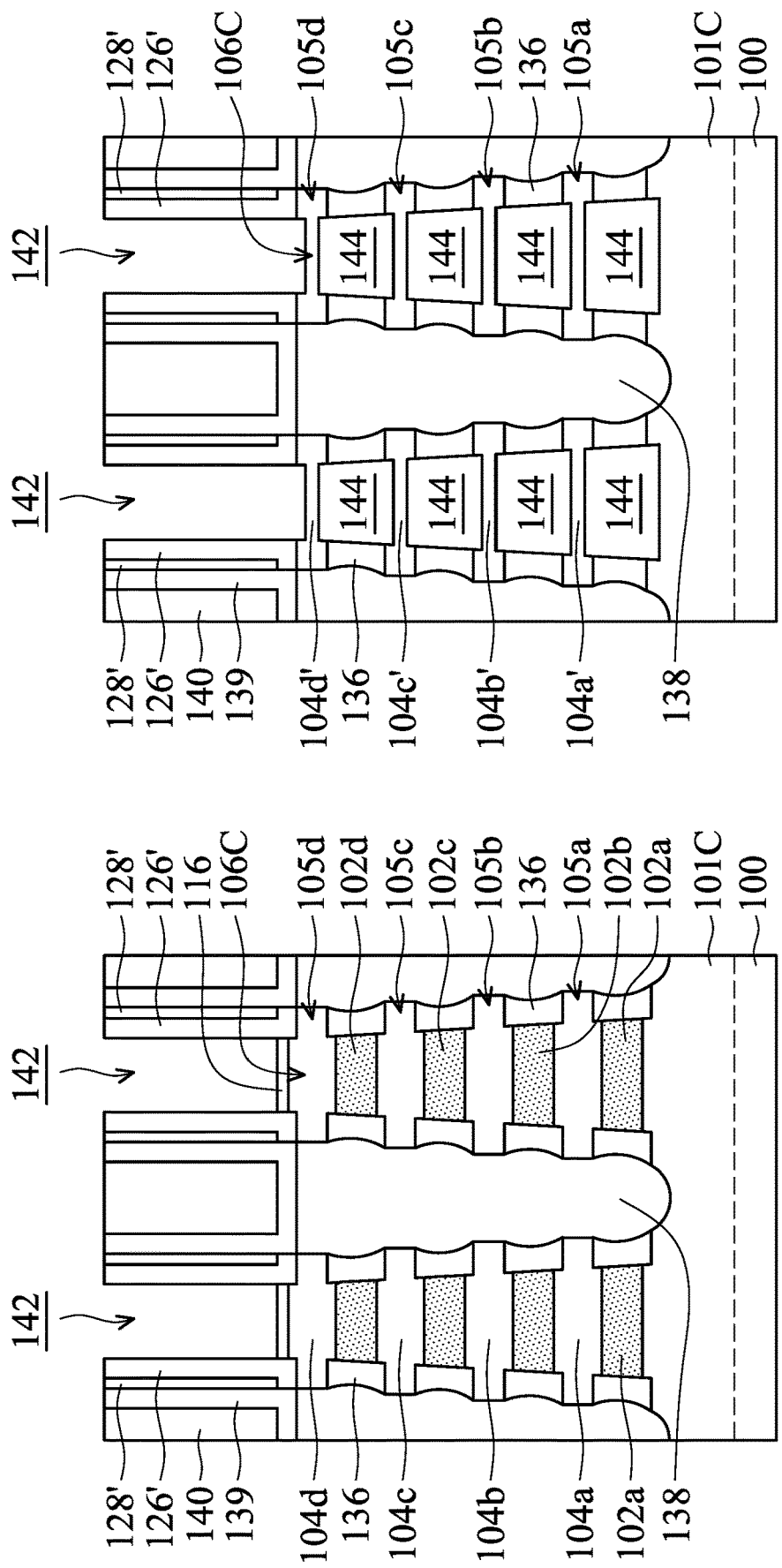

As shown in FIG. 3I, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

As shown in FIG. 3J, the dummy gate dielectric layer 116 and the semiconductor layers 102a-102d (that function as sacrificial layers) are removed, in accordance with some embodiments. In some embodiments, one or more etching processes are used to remove the dummy gate dielectric layer 116 and the semiconductor layers 102a-102d. As a result, recesses 144 are formed, as shown in FIG. 3J. In some embodiments, due to the introduction of the dopants 304 into the semiconductor layers 102a-102d (as illustrated in FIG. 1D), the process window for forming the recesses 144 are enlarged.

Due to high etching selectivity, the semiconductor layers 104a-104d are slightly (or substantially not) etched. The remaining portions of the semiconductor layers 104a-104d form multiple semiconductor nanostructures 104a'-104d'. The semiconductor nanostructures 104a'-104d' are constructed by or made up of the remaining portions of the semiconductor layers 104a-104d. The semiconductor nanostructures 104a'-104d' suspended over the semiconductor fin 101C may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge portions 105a-105d since the edge portions 105a-105d are surrounded by other elements and thus are prevented from being reached and etched by the etchant.

After the removal of the semiconductor layers 102a-102d (that function as sacrificial layers), the recesses 144 are formed. The recesses 144 connect to the trench 142 and surround each of the semiconductor nanostructures 104a'-104d'. Even if the recesses 144 between the semiconductor nanostructures 104a'-104d' are formed, the semiconductor nanostructures 104a'-104d' remain being held by the epitaxial structures 138. Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138 from being etched or damaged. The quality and reliability of the semiconductor device structure are improved.

As shown in FIG. 3K, metal gate stacks 156A and 156B are formed to fill the trenches 142, in accordance with some embodiments. The metal gate stacks 156A and 156B further extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3K.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

In the embodiments illustrated in FIG. 3K, the fin structure 106C is formed directly above the first doped region $W_N$. However, embodiments of the disclosure are not limited thereto. Many variations and/or modifications can be made to embodiments of the disclosure.

FIG. 4 is a cross-sectional view of a portion of a semiconductor device structure, in accordance with some embodiments. In some embodiments, the fin structure 106D is formed directly above the second doped region $W_P$. The processes the same as or similar to those illustrated in FIGS. 3A-3K may be performed to form an NMOS device such as that shown in FIG. 4.

Embodiments of the disclosure form a semiconductor device structure with gate all around structure. A thermal operation is performed to an n-type doped region in a semiconductor substrate such the some n-type dopants diffuse out of the n-type doped region and enter a closed reaction chamber where the semiconductor substrate is positioned. Afterwards, a semiconductor stack is formed over the semiconductor substrate, and some of the n-type dopants spread in the closed reaction chamber are introduced into the semiconductor stack. Due to the introduction of the n-type dopants, the etching selectivity between sacrificial layers and semiconductor layers in the semiconductor stack is improved. The process window of subsequent removal of the sacrificial layers is enlarged. The performance and reliability of the semiconductor device structure are therefore improved.

In accordance with some embodiments, a method for forming a semiconductor device structure is provided. The method includes forming an n-type doped region in a semiconductor substrate and forming a semiconductor stack over the semiconductor substrate. The semiconductor stack has multiple sacrificial layers and multiple semiconductor layers laid out alternately. The method also includes introducing n-type dopants from the n-type doped region into the semiconductor stack during the forming of the semiconductor stack. The method further includes patterning the semiconductor stack to form a fin structure and forming a dummy gate stack to wrap around a portion of the fin structure. In addition, the method includes removing the dummy gate stack and the sacrificial layers to release multiple semiconductor nanostructures made up of remaining portions of the semiconductor layers. The method includes forming a metal gate stack to wrap around the semiconductor nanostructures.

In accordance with some embodiments, a method for forming a semiconductor device structure is provided. The method includes forming an n-well region and a p-well region in a semiconductor substrate. The method also includes heating the semiconductor substrate so that n-type dopants diffuse out of the n-well region. The method further includes forming a semiconductor stack over the semiconductor substrate. The semiconductor stack has multiple sacrificial layers and multiple semiconductor layers laid out alternately. In addition, the method includes introducing portions of the n-type dopants from the n-well region into the sacrificial layers during the forming of the semiconductor stack. The method includes patterning the semiconductor stack to form a fin structure and forming a dummy gate stack to wrap around a portion of the fin structure. The method also includes removing the dummy gate stack and the sacrificial layers to release multiple semiconductor nanostructures made up of remaining portions of the semiconductor layers. The method further includes forming a metal gate stack to wrap around each of the semiconductor nano structures.

In accordance with some embodiments, a method for forming a semiconductor device structure is provided. The method includes forming a well region in a semiconductor substrate and forming a semiconductor stack over the semiconductor substrate. The semiconductor stack has multiple sacrificial layers and multiple semiconductor layers laid out alternately. The method also includes introducing dopants from the well region into the semiconductor stack during the forming of the semiconductor stack. The method further includes patterning the semiconductor stack to form a fin structure and removing the sacrificial layers to release a plurality of semiconductor nanostructures made up of remaining portions of the semiconductor layers. In addition, the method includes forming a metal gate stack to wrap around the semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a well region in a semiconductor substrate;
    forming a semiconductor stack over the semiconductor substrate, wherein the semiconductor stack has a plurality of sacrificial layers and a plurality of semiconductor layers laid out alternately;
    introducing dopants from the well region into the semiconductor stack during the forming of the semiconductor stack;
    patterning the semiconductor stack to form a fin structure;
    removing the sacrificial layers to release a plurality of semiconductor nanostructures made up of remaining portions of the semiconductor layers; and
    forming a metal gate stack to wrap around the semiconductor nanostructures.

2. The method for forming a semiconductor device structure as claimed in claim 1, further comprising heating the semiconductor substrate in a closed reaction chamber so that a plurality of dopants diffuse out of the well region before the semiconductor stack is formed.

3. The method for forming a semiconductor device structure as claimed in claim 2, wherein the semiconductor substrate is not taken out of the closed reaction chamber after the semiconductor substrate is heated and before the semiconductor stack is formed.

4. The method for forming a semiconductor device structure as claimed in claim 3, further comprising forming a semiconductor seed layer over the semiconductor substrate in-situ in the closed reaction chamber after the semiconductor substrate is heated and before the semiconductor stack is formed, wherein the semiconductor stack is formed directly on the semiconductor seed layer.

5. The method for forming a semiconductor device structure as claimed in claim 2, wherein the semiconductor substrate is heated at a first temperature, the semiconductor stack is formed at a second temperature, and the first temperature is higher than the second temperature.

6. A method for forming a semiconductor device structure, comprising:
    forming an n-type doped region in a semiconductor substrate;
    forming a semiconductor stack over the semiconductor substrate, wherein the semiconductor stack has a plurality of sacrificial layers and a plurality of semiconductor layers laid out alternately;
    introducing n-type dopants from the n-type doped region into the semiconductor stack during the forming of the semiconductor stack;
    patterning the semiconductor stack to form a fin structure;
    forming a dummy gate stack to wrap around a portion of the fin structure;
    removing the dummy gate stack and the sacrificial layers to release a plurality of semiconductor nanostructures made up of remaining portions of the semiconductor layers; and
    forming a metal gate stack to wrap around the semiconductor nanostructures.

7. The method for forming a semiconductor device structure as claimed in claim 6, wherein the fin structure is formed directly above the n-type doped region.

8. The method for forming a semiconductor device structure as claimed in claim 6, further comprising forming a p-type doped region in the semiconductor substrate before the semiconductor stack is formed, wherein the fin structure is formed directly above the p-type doped region.

9. The method for forming a semiconductor device structure as claimed in claim 6, further comprising heating the semiconductor substrate so that a plurality of n-type dopants diffuse out of the n-type doped region before the semiconductor stack is formed.

10. The method for forming a semiconductor device structure as claimed in claim 9, wherein the semiconductor substrate is heated in a closed reaction chamber.

11. The method for forming a semiconductor device structure as claimed in claim 10, wherein the semiconductor stack is formed in-situ in the closed reaction chamber.

12. The method for forming a semiconductor device structure as claimed in claim 11, wherein a vacuum of the closed reaction chamber is not broken while the semiconductor substrate is heated and the semiconductor stack is formed.

13. The method for forming a semiconductor device structure as claimed in claim 12, further comprising forming a semiconductor seed layer over the semiconductor substrate in-situ in the closed reaction chamber after the semiconductor substrate is heated and before the semiconductor stack is formed.

14. The method for forming a semiconductor device structure as claimed in claim 10, further comprising introducing hydrogen gas into the closed reaction chamber while the semiconductor substrate is heated.

15. The method for forming a semiconductor device structure as claimed in claim 10, wherein the semiconductor substrate is heated at a temperature ranging from about 900 degrees C. to about 1100 degrees C.

16. A method for forming a semiconductor device structure, comprising:
    forming an n-well region and a p-well region in a semiconductor substrate;
    heating the semiconductor substrate so that a plurality of n-type dopants diffuse out of the n-well region;
    forming a semiconductor stack over the semiconductor substrate, wherein the semiconductor stack has a plurality of sacrificial layers and a plurality of semiconductor layers laid out alternately;
    introducing portions of the n-type dopants from the n-well region into the sacrificial layers during the forming of the semiconductor stack;
    patterning the semiconductor stack to form a fin structure;
    forming a dummy gate stack to wrap around a portion of the fin structure;
    removing the dummy gate stack and the sacrificial layers to release a plurality of semiconductor nanostructures made up of remaining portions of the semiconductor layers; and
    forming a metal gate stack to wrap around each of the semiconductor nano structures.

17. The method for forming a semiconductor device structure as claimed in claim 16, wherein the semiconductor substrate is heated at a temperature ranging from about 900 degrees C. to about 1100 degrees C.

18. The method for forming a semiconductor device structure as claimed in claim 16, wherein the heating of the semiconductor substrate, the forming of the semiconductor stack, and the introducing of the portions of the n-type dopants are performed in-situ in a closed reaction chamber.

19. The method for forming a semiconductor device structure as claimed in claim 18, further comprising forming a semiconductor seed layer over the n-well region and the p-well region after the heating of the semiconductor substrate and before the forming of the semiconductor stack.

20. The method for forming a semiconductor device structure as claimed in claim 16, wherein the fin structure is formed directly above the p-well region.

* * * * *